(12) United States Patent  (10) Patent No.: US 8,554,530 B1
O'Riordan et al.  (45) Date of Patent: Oct. 8, 2013

(54) METHODS AND SYSTEMS FOR PROPERTY ASSERTION IN CIRCUIT SIMULATION

(75) Inventors: Donald O'Riordan, Sunnyvale, CA (US); Prabal K. Bhattacharya, Cupertino, CA (US); Walter Hartong, Isen (DE); Richard John O'Donovan, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1056 days.

(21) Appl. No.: 12/485,625

(22) Filed: Jun. 16, 2009

Related U.S. Application Data

(60) Provisional application No. 61/145,816, filed on Jan. 20, 2009.

(51) Int. Cl.
  *G06F 17/50* (2006.01)
(52) U.S. Cl.
  CPC ................................. *G06F 17/5022* (2013.01)
  USPC ................................. 703/14; 703/17; 716/106
(58) Field of Classification Search
  USPC .................. 703/13–14, 16–17; 716/106, 111
  See application file for complete search history.

(56) References Cited

U.S. PATENT DOCUMENTS

| | | | |
|---|---|---|---|
| 6,675,138 B1 * | 1/2004 | Hollander et al. | 703/13 |
| 8,195,439 B1 * | 6/2012 | Hussain | 703/14 |
| 2005/0120315 A1 * | 6/2005 | Miura et al. | 716/4 |
| 2007/0168172 A1 * | 7/2007 | Hong et al. | 703/14 |
| 2009/0019406 A1 * | 1/2009 | Endoh et al. | 716/5 |

OTHER PUBLICATIONS

Lettnin et al. "Verification of Temporal Properties in Automotive Embedded Software". 2008 EDAA. 6 Pages.*
Maler et al. "Monitoring Temporal Properties of Continuous Signals"., Springer. 2004., 16 Pgaes.*
Belluomini et al. "Timed Circuit Verification Using TEL Structures." IEEE 2001. p. 129-146.*

* cited by examiner

*Primary Examiner* — Eunhee Kim
(74) *Attorney, Agent, or Firm* — Kenyon & Kenyon LLP

(57) ABSTRACT

Systems and methods for simulating and verifying a design are contemplated. Various embodiments determine a set of verification rules for a design, wherein the verification rules use a PSL or SVA syntax in a SPICE netlist to describe a property of the circuit design. The state of a circuit at a simulated first time, $t_1$, can be determined. The state at the first time, $t_1$, may be analyzed to determine if a triggering event has occurred. Based on the occurrence of the triggering event, the systems and methods can verify the state at the first time, $t_1$, against the set of verification rules. Some embodiments of the systems and methods described herein can include a mixed-signal circuit including an analog portion and a digital portion, and the analog portion, the mixed-signal portion, or both, may be simulated and verified.

39 Claims, 8 Drawing Sheets

METHODS AND SYSTEMS FOR PROPERTY ASSERTION IN CIRCUIT SIMULATION

CROSS-REFERENCE TO RELATED APPLICATIONS

This application claims the benefit of U.S. Provisional Application No. 61/145,816, filed on Jan. 20, 2009.

TECHNICAL FIELD

The present invention generally relates to circuit simulation, and more particularly, some embodiments relate to analog circuit simulation and verification.

DESCRIPTION OF THE RELATED ART

Various circuit simulators such as the SPICE simulator are useful tools for solving and verifying electrical circuits. SPICE, which stands for Simulation Program with Integrated Circuit Emphasis, is a general-purpose circuit simulation program for nonlinear dc, nonlinear transient, and linear ac analyses, and is often used to model devices of an integrated circuit design. Circuit descriptions are typically provided to and captured by SPICE in a netlist format, although schematic capture front-ends are also available to allow automated generation of the netlist. The circuits for which the descriptions are captured can be circuits that implement analog, digital, or mixed signal devices.

The simulator parses the netlist and creates a system of equations for the circuit using methods such as Modified Nodal Analysis (MNA). The equations are solved by various analysis techniques such as DC analysis, AC small-signal analysis, transient analysis, Pole-Zero analysis, and so on. The equations may represent, for example, circuit node voltages, currents, transconductance, and other operating conditions or parameters of the circuit.

At each transient time point in the time-based transient analysis, there are two major phases to the solution process: (1) formulating a system of equations by applying the Modified Nodal Analysis to the design, which may be done by filling in the system of equations using values obtained by evaluating device model equations; and (2) solving the system of equations. Because the simulator may be asked to solve non-linear equations, the phases can be performed within an iterative loop until the sequence of solutions converges upon an acceptable solution. The iterations may sometimes fail to converge or exceeding a maximum iteration count. During a transient analysis, the simulator may therefore reject the trial time point that failed to converge and attempt to obtain the circuit solution at an earlier time. This is repeated until convergence is achieved and before moving forward with time and continuing the process.

The Cadence® Virtuoso® Spectre® simulator and its associated netlist language support the concept of an assert statement and associated analyses, which can be used to enable and disable various assert statements. These assert statements are generally used to set custom characterization checks to specify safe or acceptable operating conditions for the devices that make up the circuit. Further, the Spectre netlist language allows evaluated expressions to be checked. Such expressions can contain instance parameters, operating point parameters, netlist parameters, sub-circuit parameters, node voltages, device terminal currents, or Boolean expressions. In addition, the Spectre netlist language also allows durations and time ranges to be specified. A duration is a period of time for which a warning is generated if a check is violated for that period. Checks defined in this manner can be further controlled via the Spectre netlist language's checklimit analysis. Individual assert statements, or groups of assert statements can be enabled or disabled for values of time in a subsequent transient analysis, or within specific time windows for a subsequent transient analysis.

The assert statement and the checklimit analysis syntaxes and their associated documented semantics allow a reasonable variety of relatively simple circuit-level or transistor-level analog parameters (or expressions involving voltages, currents or other circuit parameters) to be verified during transient analysis simulation. However, the assert statements can also have limitations. For example, there is no capability to predicate the assertions on some time-varying or circuit-varying conditions, and no simple ability to specify a check for a more complex condition. Such conditions include requirements to monitor multiple voltages on multiple nodes, to verify complicated output voltage ranges on various outputs for complicated predefined times, or to verify complex devices returning to specific operating regions within a predefined time after exiting the operating region due to an intricate stimulus.

Some systems provide a scripting language interface within a circuit simulator. This approach provides the user with a general scripting language, such as Tcl. By its very nature, this general scripting language is too general, and not particularly focused on the task of verifying the types of circuit and device level as described herein.

Standard Assertion Languages such as Property Specification Language ("PSL") and SystemVerilog Assertions ("SVA") have evolved to meet the needs of logic designers and verification engineers in a discrete, event-driven simulation. These are used both with dynamic (simulation-based and accelerator-based) testing and Formal Verification (a form of static analysis) methods. Such Assertion Languages provide a formal framework for posing and verifying some questions about the circuit design. Additional information on PSL can be found in the IEEE 1850 Standard Property Specification Language. For additional information on SVA, see the SystemVerilog Assertions section of the SystemVerilog IEEE standard P1800-2005.

Some systems have extended PSL to handle certain forms of analog verification tasks via the introduction of a Signal Temporal Logic. This mathematical approach has focused mostly on the high-level aspects of a specification language tailored at working on typical analog waveforms and does not provide any syntax or semantics for dealing with SPICE-level objects. There is no connection to a SPICE netlist or to the transient analysis engine within a SPICE simulator. The language provides semantics for waveform objects, but nothing for dealing with SPICE model parameters, device operating parameters, and other similar model parameters.

BRIEF SUMMARY OF EMBODIMENTS OF THE INVENTION

According to various embodiments of the invention, systems and methods for simulating and verifying a design are contemplated. Various embodiments determine a set of verification rules for a design, wherein the verification rules use a PSL or an SVA syntax in a SPICE netlist to describe a property of the circuit design. The state of a circuit at a simulated first time, $t_1$, can be determined. The state at the first time, $t_1$, may be analyzed to determine if a triggering event has occurred. Based on the occurrence of the triggering event, the systems and methods can verify the state at the first time, $t_1$, against the set of verification rules. Some embodiments of the systems and methods described herein can include an analog circuit, a digital circuit, or a mixed-signal circuit. A mixed signal circuit includes an analog portion and a digital portion, and the analog portion, the mixed-signal portion, or both, may be simulated and verified.

Various embodiments may determine a state for the circuit at a simulated second time, $t_2$. The systems and methods may check for convergence for a set of solutions for a series of equations at a simulated second time, $t_2$. The second time, $t_2$ can be after the first time, $t_1$. Some embodiments may check for convergence for a set of solutions for a series of equations at another time, $t_{2*}$, where $t_{2*}$, is between $t_1$ and $t_2$. This may occur, for example, when the solution involving the series of equations at the simulated second time, $t_2$, is rejected. For example, the systems and methods may check for convergence for a set of solutions for a series of equations at another time, $t_{2*}$, because a set of solutions for a series of equations at a simulated time, $t_2$, did not converge within a number of calculations.

In some embodiments, triggering a verification can occur based on the convergence of a set of solutions to equations that model the circuit being simulated. Triggering a verification may also occur based on checking a threshold, such as a voltage or current maximum or minimum. Triggering a verification can also be based on a change in a measured value that is greater than a predetermined amount, for example, $\Delta x$, a change in the measured value that occurs in less than some predetermined period, for example, $\Delta x/\Delta t$, or based on a predetermined verification trigger time. Additionally, the predetermined verification trigger time can be based on the time of an event. Additionally, various embodiments of the systems and methods described herein can model a digital, analog, or a mixed-signal circuit using a netlist, such as a SPICE netlist using, for example, SPICE-named spaced objects and SPICE computed attributes within PSL or SVA syntaxes.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE
EMBODIMENTS OF THIS INVENTION

The present invention relates generally to circuit simulation, and more particularly, some embodiments relate to analog simulation and verification. According to various embodiments of the systems and methods described herein, a set of verification rules for a design are developed, and the circuit design is simulated and verified against those design rules. The state of a circuit at a simulated time, $t_1$, can be evaluated and analyzed to determine if a triggering event has occurred. Upon the occurrence of the triggering event, the state of the circuit at time $t_1$ can be verified against the set of verification rules.

Figure 1:
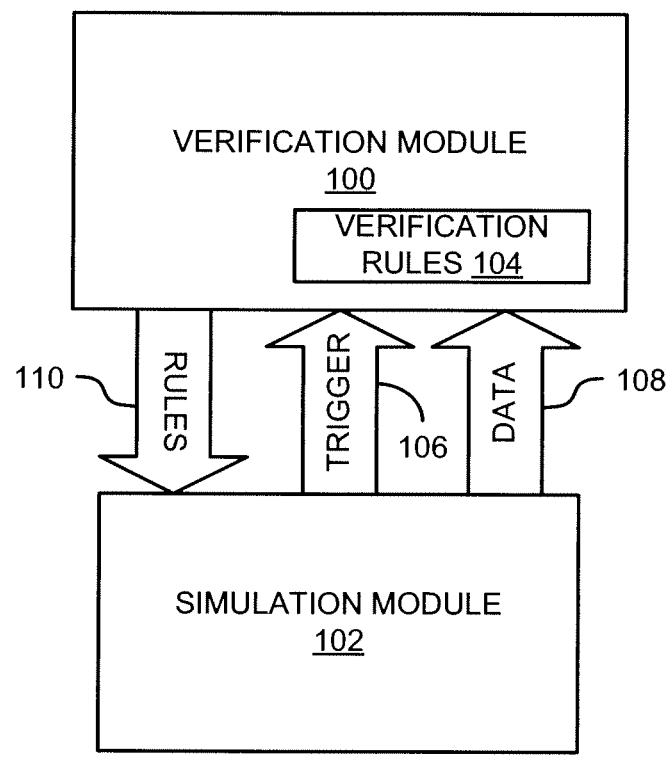
FIG. 1 is a diagram illustrating an example tool for circuit design verification in accordance with the systems and methods described herein.

FIG. 1 is a diagram illustrating an example simulation and verification tool in accordance with the systems and methods described herein. Referring now to FIG. 1, the device includes a simulation module 102 and a verification module 100. The simulation module 102 can be implemented as a circuit simulation tool to simulate circuit designs for verification purposes. In some embodiments, the simulation module can include any suitable circuit simulator such as, for example SPICE simulators or other like circuit simulators. The SPICE simulator, for example, can be implemented to evaluate circuits made up of analog components used to implement analog, digital or mixed signal designs. It should be appreciated that the selection of a suitable circuit simulator is preferably based on the type and characteristics of the components that make up the circuits to be simulated.

The verification module interfaces with simulation module 102 and can be used to apply the verification rules 104 to the simulation results to verify operation of the circuit design in accordance with the verification rules 104. Examples of verification rules 104 can include rules for determining verification events such as, for example, when a trigger 106 should occur or when a change in a circuit under test should be reported. Verification rules 104 can also include rules for defining correct circuit operation, and other rules related to circuit operation.

In some embodiments, a verification trigger is generated by the tool when a trigger event occurs, and is used to initiate a verification or flag simulation data for verification. Trigger events can be defined based on the verification rules so that the trigger identifies or captures simulation data that is relevant to one or more verification rules. In the example illustrated in FIG. 1, the verification module 100 parses the verification rules 104 to identify rules 110 that can be used by the simulator to determine and flag the occurrence of trigger events and generate verification triggers 106. In another embodiment, the verification rules 104 can be provided to the simulator so the simulator can identify trigger events based on the rules. Trigger events can be specified as rules themselves or can be derived from the rules by either the simulation module 102 or the verification module 100. As the examples provided below illustrate, the rules themselves often specify one or more expected circuit parameters upon the occurrence of specified conditions.

Accordingly, upon the occurrence of conditions to indicate a trigger event, a verification trigger 106 is generated and sent to verification module 100 along with the data 108 to be verified against the verification rules 104 for that trigger event. Trigger events can include convergences, states, or changes in the state of the circuit design, such as, for example: an increase in the voltage above a threshold on a node in the circuit; a decrease in voltage below a threshold on a node in the circuit; an increase in current above a threshold through a portion of the circuit; and a decrease in current below a threshold through a portion of the circuit.

Upon the occurrence of a trigger event, the verification trigger 106 and simulation data 108 are provided to the verification module 100. The simulation data 108 can include functional information of the circuit being simulated. This information can include, for example, voltages at selected nodes in the circuit, current flow through circuit components or paths, and other information about the operation of the circuit. The verification module 100 process the data 108 against the rules 104 to determine if the circuit is functioning as specified by the rules. The system may also generate alerts, messages or other reporting events upon the occurrence of verification events such as a successful verification, an out of bound condition or other verification event. For example, an alert may be generated when the voltage at a node changes by more than a predetermined amount.

Some simulation systems 102, generate a Jacobian matrix, A, using techniques such as Modified Nodal Analysis (MNA), Nodal Analysis (NA), or other techniques. The vector b, commonly known as the residual vector, is also constructed using such techniques, forming a system of equations: $Ax=b$, where x is a vector representation of unknown circuit characteristics to be solved. During any particular Newton-Raphson iteration (i), a system of linearized equations may be formulated. The simulator 102 linearizes about the previous solution value $x_{i-1}$. Accordingly, for any given iteration, the values present in the Jacobian matrix and the residual vector are functions of the solution vector x of the previous iteration. The iterative process continues, solving for a new value of x, after which a new system is built and solved until successive solutions converge upon acceptable values for the circuit unknowns in x. In representative psuedo-code this procedure may be respresented as:

foreach (DC solution or transient analysis trial timepoint) {
    foreach Newton-Raphson Iteration, i {
    linearize the system of non-linear equations
    about previous solution i−1
    formulate system of linear equations $Ax=b$
    solve system of linear equations $Ax=b$ for solution
    vector, x
    }
    }

With circuit simulation, the iterations may sometimes fail to converge. For example, convergence might not be achieved within a predefined maximum iteration count. During a transient analysis, the analog simulator may therefore reject the trial time point that failed to converge and attempt to obtain the circuit solution at an earlier time. This is repeated until convergence is achieved before continuing the process. There may also be other reasons for rejecting a fully converged trial time and choosing an earlier time. For example, a local truncation error (LTE) may result, which further complicates the process.

The selection of trial time points is algorithmically determined, as is the decision of when to reject a particular time point. As such, an exemplary sequence of trial time points may arise as follows:
0.0 0.1 0.3 0.5(rejected) 0.4 0.45 0.52 0.62 0.8 1.2(rejected) 0.95

The time point sequence is generally increasing. However, it is not monotonically increasing because the solutions at times 0.5 and 1.2, for example, are rejected (either due to non-convergence or other reasons such as LTE related considerations). After the first rejection, the time point is reduced to 0.4, and after the second rejection, it is reduced to 0.95. After each rejection, simulation continues from the new (reduced) time point.

The following example demonstrates an embodiment of the present invention through the use of the Cadence Virtuoso Spectre simulator. However, it should be appreciated that embodiments of the present invention are not limited to the use of the Cadence Virtuoso Spectre simulators, and the general concepts and principles from this example can apply to embodiments using other circuit simulators. The Cadence Virtuoso Spectre simulator netlist language supports the concept of an assert statement and associated analyses, which can be used to enable and disable various assert statements. These assert statements are generally used to set custom characterization checks to specify the safe operating conditions for the devices that make up the circuit. The Spectre circuit simulator then issues messages telling the user when parameters move outside the safe operating area. The safe operating area is generally defined by the user of the simulation tool, by specifying a minimum and maximum parameter value. Additionally, the tools also issue messages when the parameters return to the safe area. Various types of device parameter, model parameter and instance parameters (such as operating point parameters or other instance parameters) are supported. The parameters being checked include device instance and sub-circuit parameters in addition to SPICE model parameters.

The syntax for defining an assertion check in the Spectre netlist language is:
Name               assert               [sub=subcircuit_master] [subs=subcircuit_masters]
   {primitive=primitive|mod=model|dev=instance}
   {param=parameter_name|modelparam=parameter| expr="mdl_expr"}
   [min=value] [max=value]
   [duration=value]
   [message="message"] [level=notice|warning|error]
   [boolean=true|false]
   [info=yes|no]

Further, the Spectre netlist language allows for evaluated expressions ("mdl_expr" for example, in the syntax shown above) to be checked. Such expressions can contain instance parameters, operating point parameters, netlist parameters, sub-circuit parameters, node voltages, device terminal currents, or Boolean expressions. The expression is checked within the scope of the specified sub-circuit, device primitive, model, or scoped instance within a design hierarchy. The Spectre circuit simulator displays an error message when a Boolean expression is true (by default) or when a non-Boolean expression crosses the maximum or minimum value. In addition, the Spectre netlist language also allows for the specification of durations and time ranges. A duration is a period during transient analysis over which the check has to be violated before a warning is displayed. Checks defined in this manner can be further controlled via the Spectre netlist language's checklimit analysis. Individual assert statements, or groups of assert statements can be fully enabled or disabled for all values of time in any subsequent transient analysis, or within specific time windows for any subsequent transient analysis.

The syntax for a check-limit analysis within the Spectre circuit simulator is:
Name checklimit [enable=["check1" "check2" . . . "checkn"]]
    [disable=["check1" "check2" . . . "checkn"]]
    [start=value][stop=value]
    [check_windows[start1 stop1 start2 stop2 . . . ]]
    [boundary_type=time|sweep]
    [severity=none|notice|warning|error]
    [checkallasserts=yes|no]

The Spectre netlist language also provides the check statement, which checks the values of the component parameters only to be sure that the values of the component parameters are reasonable. Checks can be performed on input, output, or operating-point parameters. The Spectre simulator checks parameter values against parameter soft limits. The syntax for a check statement within the Spectre netlist language is:
ParamChk check what= [none|models|input|output|all|oppoint]

A parameter range limits file is also fed to the simulator, in which a series of statements along the following lines allow parameter range limits to be specified:
[ComponentKeyword] [model] [LowerLimit<[=]]
    [|]Param[|] <[=] UpperLimit]

Figure 2:
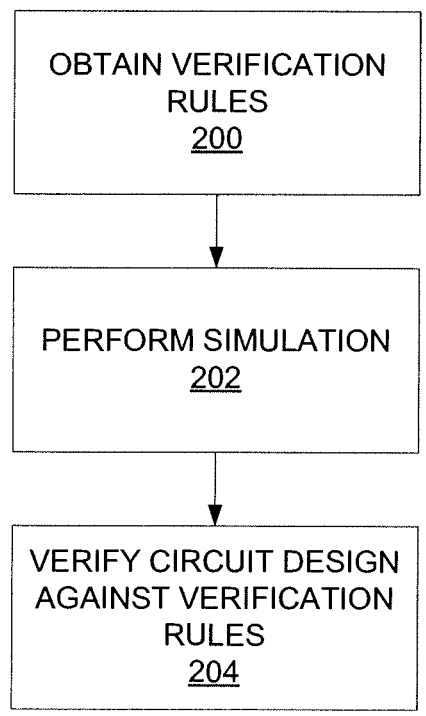
FIG. 2 is a flowchart illustrating an example method for circuit design simulation and verification in accordance with the systems and methods described herein.

FIG. 2 is a flowchart illustrating an example method in accordance with the systems and methods described herein. Referring now to FIG. 2, in step 200, a set of rules is generated and the rules are provided to the simulation and verification system. For example, this set of rules parameters and conditions a circuit design is expected to meet based performance criteria for that circuit. As discussed above, the rules can relate to triggering, expected circuit operation, and to other circuit operations. The rules can be processed by the simulator to facilitate verification operations. For example, the simulation and verification modules can parse the rules and identify characterization parameters as well as trigger points or other events at which the characterization parameters are tested for verification. The rules can also establish or specify reporting or alert criteria for notifying the user or other systems of circuit operation and conditions determined as a result of the verification operations. For example, the system can be configured to generate a report of the circuit's simulation results for in-bounds conditions, out-of-bounds conditions, or both. Reporting can be in real-time as events occur or post simulation reporting. Likewise, the reporting information can be stored for statistical analysis and historic purposes. The system can be configured to report the error during the simulation run, at the end of the simulation run, or at other times. In some cases, the system may continue simulating despite the error or may abort the simulation run all together.

In step 202, a circuit simulation is performed by a simulation module. The simulation may be based on any suitable circuit simulator—for example, a simulation system such as SPICE. The simulations may be managed by or operated in conjunction with a verification module, which can operate the simulation in accordance with procedures appropriate for a given set of verification rules. For example, the verification module can be configured to initiate the simulation, request or examine circuit characteristics and parameters at trigger events, continue the simulation and so on. In other embodiments, the simulation can be initiated and run, and configured to send data to the verification module without control by the verification module. During simulation, the verification module can receive or obtain circuit characteristics and parameters from the simulation modules that can be used in verification (step 204, below). These can include voltages at circuit nodes or across circuit elements or sections, currents through a circuit element, and other characteristics or parameters that provide information about circuit operation or performance or that can be used to evaluate the same.

In step 204, the circuit design being simulated is verified against the set of verification rules. In one embodiment, this is performed by the verification module that is operating in conjunction with the simulation module. The verification rules can be configured to check the received parameters during or after simulation to test whether the circuit being simulated is operating in accordance with defined specifications. For example, the rules can include parametric requirements such as expected voltages (or voltage ranges) at various nodes in the circuit at various times or upon the occurrence of specified conditions. As a further example, the rules might define parametric specifications such as maximum or minimum voltage thresholds, nominal voltages or voltage ranges, expected changes in voltage, and other aspects of the circuit operation that are expected or required for the design to meet specifications. In addition to voltage parameters, the rules might define maximum currents, minimum currents, current changes based on changes in other signals and other changes in the circuit being simulated and verified. In other embodiments, the rules may define mathematical or temporal expressions to evaluate performance based on the voltages, currents or other measured parameters. As these examples serve to illustrate, a number of different parameters or characteristics can be examined for verification.

The rules can also define times at which these specified parameters are expected to occur. For example, voltage at a given node might be specified to be constant within a specified range over a given time. The time can be specified as an absolute time, t, in the simulation, as a time from another simulation event, and so on. As another example, the voltage at a given node might be specified to be at a predetermined value at a given time, t, in the simulation, upon the occurrence of another simulation event (for example, when the input to a stage of the circuit reaches a predefined level), or other specified time. As these examples illustrate, depending on the circuit design, the sampled parameters are typically expected to vary based on changing inputs to the circuit or other dynamic conditions in the circuit during simulation.

In various embodiments of the systems and methods described herein, continuous time varying systems, such as analog circuits, are modeled and analyzed at specific times based on triggering events. These triggering events can include predetermined changes in simulated circuit currents or voltages such as, for example, $\Delta I$ or $\Delta V$. In some examples, triggers can be based on anticipated convergence of a set of simulation results for a particular simulated time, a predetermined change in simulated circuit currents or voltages over time, for example, $\Delta I/\Delta t$ or $\Delta V/\Delta t$.

Figure 3:
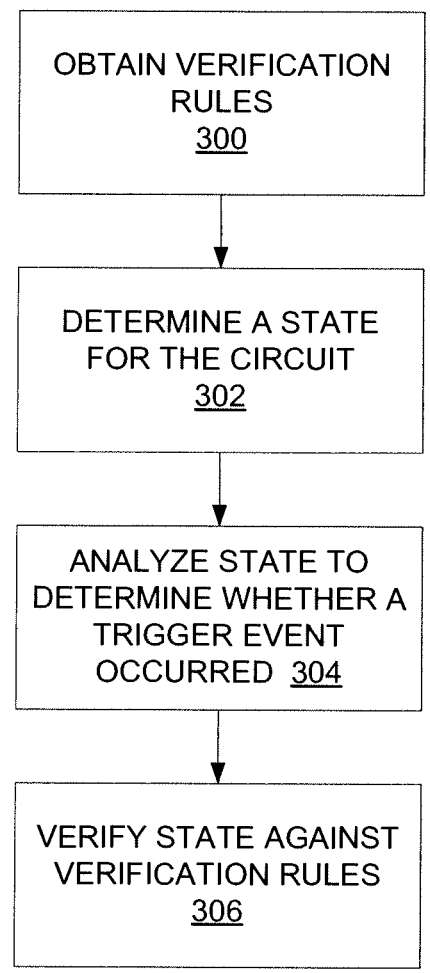
FIG. 3 is a flowchart illustrating an example method for verification triggering in accordance with the systems and methods described herein.

FIG. 3 is another flowchart illustrating an example method in accordance with the systems and methods described herein. Referring now to FIG. 3, in a step 300, a set of rules may be received. As discussed above, the rules can be related to triggering, expected circuit operation, or other circuit operating characteristics. In a step 302, the state of a circuit is determined. The state of a circuit may include the voltage at a particular node or particular set of nodes in the circuit. State may also include a current or currents through one or more component in the circuit. In a digital circuit the state may be a logical value, for example, logical "1" or "0." a voltage, or a current, for example. The state can be determined by performing an analog, digital, or mixed-signal simulation. The simulation may be based on any suitable circuit simulator—for example, an analog simulation system, such as SPICE.

In a step 304, an example system determines if a trigger event has occurred. In some embodiments, triggering of a verification can occur based on the convergence of a set of solutions. Generally, in some simulation tools, the results of a simulation can be generated at specific simulation times. As the simulation progresses, the simulation time can be increased and a set of results for each simulation time can be based on a previous set of results and the change in time. In some cases, the results may not converge. Accordingly, the change in simulation time between the current calculations that do not converge, and the previous results, can be decreased and new results may be calculated for the new simulation time that is closer in time to the previous results. When the convergence does occur, it might be used to trigger a verification event in which the circuit state can be analyzed to determine the truth of the verification rules.

In some embodiments, triggering a verification may also occur based on checking a threshold or trigger rule. The threshold or trigger rule might be a voltage threshold, a current threshold, or other threshold based on the circuits performance or operation. The threshold might be a minimum, a maximum, or both, for example, a minimum of 1V, a maximum of 2V or both for a given node in a simulated circuit. Additionally, the threshold might be based on a specific time, such as a simulated absolute time, for example, 20 ms after the start of the simulation or a simulated relative time, such as 45 ms after a particular signal, such as an input, transitions. For example, a circuit designer might direct a requirement that the voltage on a particular node must be between 2.5 and 3.5 volts within 25 ms of applying power to the design and must remain within that range until after power is removed from the circuit. If the signal goes outside those parameters, then a trigger occurs.

Triggering a verification can also be based on a change in a measured value that is greater than a predetermined amount, for example, $\Delta x$, a change in the measured value occurs in less than some predetermined period, for example, $\Delta x/\Delta t$, or based on a predetermined verification trigger time. Additionally, the predetermined verification trigger time can be based on the time of an event.

In a step 306, an analog, digital, or mixed-signal system can be verified against a set of rules that may define the expected functioning of the circuit being simulated. Similar to a threshold, a design check or verification rule might be a voltage threshold, a current threshold, or other threshold based on circuit operation or performance. The verification rule might be a minimum, maximum, or both. Additionally, the verification rule might be based on a specific time, such as a simulated absolute time, for example, 15 ms after the start of the simulation or a simulated relative time, such as 95 ms after a particular signal, such as a clock, transitions. A designer might determine that the voltage on a particular node should be between 2.5 and 3.5 volts within 25 ms of applying power to the circuit and must remain within that range until after power is removed from the circuit. If the signal goes outside those parameters then the system is operating outside of the verification rules. In some embodiments, a trigger will need to occur for the system to perform the verification rule check.

Various embodiments of the systems and methods described herein are configured to extend a conventional circuit simulator such as, for example, the SPICE simulator, to add triggering and verification capabilities. In some embodiments, this can be accomplished by: (a) introduction of a new PSL or SVA SERES-like syntax into the SPICE netlist allowing the temporal properties of interest to be described; (b) modification of standard PSL syntaxes, SVA syntaxes, or both, to allow for SPICE name-space objects (and SPICE computed attributes thereof) to be referenced therein, within both the boolean layer and within clocking statements; (c) modification of the standard PSL syntaxes, SVA syntaxes, or both, to allow "analog" expressions that contain operators and system-tasks/functions such as abs( ) idt( ) ddt( ) and (d) modification of the SPICE parser to construct the parse tree for these properties and their corresponding verification directives. The operators or system-tasks/functions can be implemented to represent various functions that can be used to describe a circuit design or a verification model to be referenced with SPICE objects or computed attributes of SPICE objects. Examples of such functions include an absolute value function, an integral with respect to time, a derivative with respect to time, and so on.

Additionally, some embodiments augment the conventional simulation engine to include a temporal property evaluation module that is configured to evaluate temporal expressions (such as SERES, for example), and to determine their status at predetermined points in simulation time. In some embodiments, this module is implemented via an observer class per the standard observer pattern. When the update method of the observer is invoked, the values of the various Boolean layer expressions can be queried from the simulator. The observer may re-evaluate the various temporal expressions to determine their state and take the appropriate action. For example, the observer may as halt the simulator, log the event to a database, or take other appropriate action. An observer can be created by following a parse tree, and can be configured to evaluate SPICE objects (or attribute thereof) referenced in the "leaf levels" of the parse tree. One set of observers (e.g., triggers) can be defined for objects used in clocking expressions, and another can be defined for those used in non-clocking expressions.

A temporal property evaluation module can be implemented in a fashion similar to that of digital simulators to evaluate temporal expressions. Example implementations buffer the evaluated states of the various expressions and evaluate the temporal expressions upon each clocking event notification. This can be done while considering both the current notification as well as previously buffered results.

In various embodiments, an extension of the standard SPICE transient analysis allows the evaluation module to be triggered at a time deemed appropriate by the SPICE transient simulation manager. In some embodiments, this extension is implemented by a concrete subject class, to iterate over all SPICE objects or attributes thereof. Such objects or attributes are referenced in the Boolean layer expression comparison functions, for which observers have been registered or attached. If any of these have crossed their defined thresholds (per the comparison functions or cross statements), then their corresponding observers are notified. In response, these observer methods trigger the appropriate portions of the temporal property evaluation engine. Should any of the temporal expressions be satisfied, the appropriate action is identified and taken.

Some embodiments of the systems and methods described herein can be configured to combine various principles and capabilities of standard digital assertion languages, property specification languages, or both. This can be done with various principles and capabilities of Spectre/SPICE/FastSpice languages while providing adequate support to access netlist objects in SPICE. Such embodiments may allow relatively complex circuit and transistor-level properties to be specified and verified within an analysis module. The analysis module may use SPICE netlists while employing SPICE-level circuit description and modeling methodologies to describe the circuit being analyzed.

Various embodiments also provide an interface by which both simple invariants and time-varying expressions involving the "objects" of the SPICE simulator (models, sub-circuits, parameters, and other SPICE objects) can be specified to and verified by the simulator.

There can be a large variety of possible analysis application areas. Some embodiments, for example, model or simulate: (1) device operating region properties; (2) simple circuit functional properties; (3) a subset of analog signal properties—specifically the single-event temporal properties or; (4) mixed-signal behavioral properties. These are examples of types of properties that can be mapped onto the existing PSL and SVA languages. This mapping can be accomplished using a set of analog or mixed-signal extensions to, for example, PSL or SVA, or by adapting capabilities of the existing "assert device" in the simulator, while making these languages aware of SPICE netlist objects within the language via explicit representation.

Furthermore, some embodiments define an assertion language or formal property specification language for other types of properties such as, for example, cumulative temporal, spectral, or noise properties. These example properties may be in the form of device specifications on device data sheets, or other device specific information.

Figure 4:
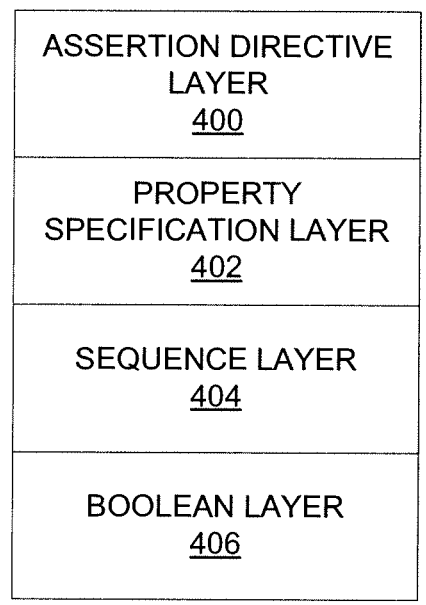
FIG. 4 is a diagram illustrating an example of layers of concurrent assertion in accordance with the systems and methods described herein.

FIG. 4 is a diagram illustrating an example of how the verification directives are categorized in a discrete, event-driven simulation environment over four layers 400, 402, 404 and 406. This categorization may be used for both PSL and SVA. In providing circuit simulation extensions and variations, various embodiments may extend the sequence layer 404 and Boolean layer 406. In some embodiments, sequence layer 404 and Boolean layer 406 extensions provide additional circuit simulation functionality to the simulation process. The terms sequence layer and temporal layer are used somewhat interchangeably in this document.

There can be a large number of classes of circuit and device level properties that could benefit from a formal property specification language and verification capability. In some embodiments, a general solution enriches the Boolean Expression layers 406 of SVA/PSL property specifications to: (1) identify a set of formal semantics to allow a substantial portion of properties of interest for analog design and verification to be captured; and (2) identify the approach language (PSL, SVA) syntax extensions to support those semantics. These property specification languages can be denoted as PSLS (PSL-SPICE) and SVAS (SVA-SPICE) respectively. Various systems and methods extend the Boolean layer 406 capabilities in an assertion-language language agnostic fashion. For PSLS, some embodiments essentially create a new Spectre/SPICE version for a subset of PSL, which are suitable for inclusion in Spectre/SPICE netlist languages, for example, within sub-circuit definitions. In some embodiments, the language extensions allow access to SPICE-level objects such as sub-circuit parameters, model parameters, and device-operating parameters, in addition to node voltages and currents.

Some embodiments may also provide mathematical and signal processing functions, such as those found in Spectre, Spectre-MDL and Verilog-A, and allow those functions to be called or referenced from within the Boolean Layer 406 expressions, for example. Additionally, some embodiments extend the appropriate subset of the PSL and SVA property specification capabilities, both sequence and Boolean layers 404, 406, to cover the desired set of functionality including a superset of that currently provided by the Spectre simulation language assert statement.

The above Boolean Layer 406 extension approaches can be implemented in some embodiments to allow for a significant richness or expressiveness that may be available in the extended property specification or assertion languages. This can allow a significant coverage of the vast array of circuits and transistor-level property types that may be supported.

Figure 5:
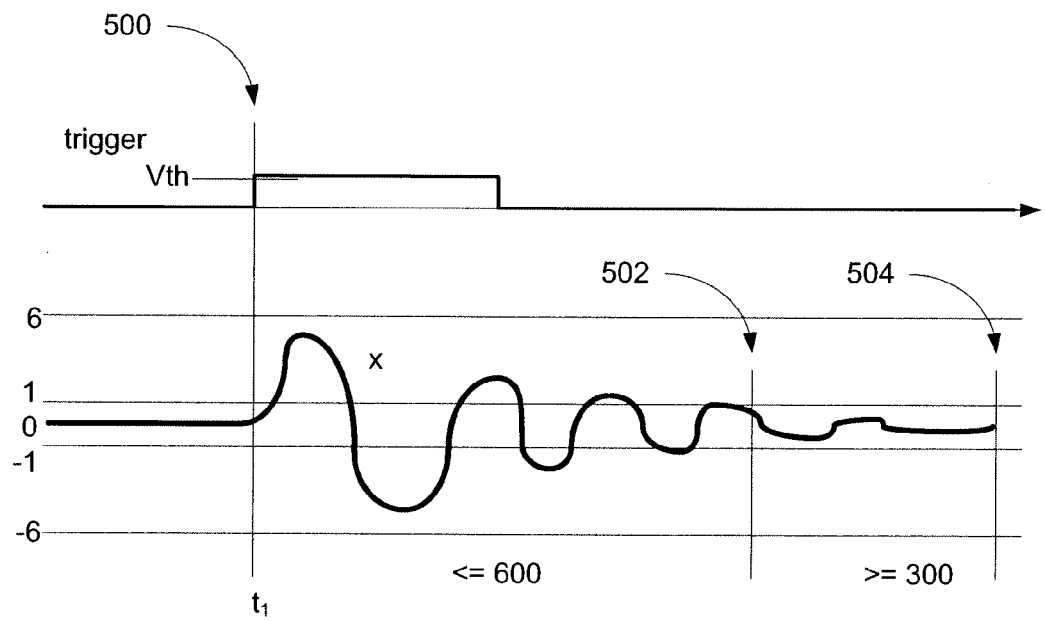
FIG. 5 is a diagram illustrating an example of signal stabilization properties.

Some embodiments may extend the temporal or sequence layer 404, by the introduction of the notion of "dense time" or continuous time. FIG. 5 is a diagram illustrating an example of signal stabilization properties in accordance with one embodiment of the invention. Referring now to FIG. 5, a graphical example of a single event temporal signal property is described. The single event temporal signal property is an example of a signal stabilization property against which a circuit being simulated can be checked. The property indicates how quickly a design should stabilize after a change of a signal in the circuit as well as how long the signal is expected to remain stable.

The example signal property illustrated in FIG. 5 specifies that when a (Boolean) trigger 500 rises above a threshold $V_{th}$ at time $t_1$, within 600 time units (indicated at 502), the voltage value of |x| has to drop below 1 volt and stay below 1 volt for at least 300 time units (indicated at 504). In accordance with this example, when the trigger 500 rises above a threshold $V_{th}$ at time $t_1$, if |x| does not drop below 1 volt within the specified 600 time units and remain for at least 300 time units, this verification test is failed.

The design requirements may be stated in an alternative manner using, for example, extensions to PSL in accordance with the systems and methods described herein. These design requirements may be rewritten, for example, in the following form.

stabilization assert:

always (abs(V(x)<6) and (cross V(trigger)–vth, +1))→ eventually[0:600] ms always[0:300] ms abs(V(x)<1v)));

In the illustrated example the references to time units [0:300] correspond to the notions of "dense time."

Some embodiments may extend the property specification layer and assertion/verification directive layers of various electronic design tools, as necessary in order to cover a broader range of property types and applications. Some example property types may be sub-divided into several major categories such as, for example: (1) support for simple invariants (conditions that must always be true); (2) support for predicated invariants (conditions that must always hold true after another condition has held true); (3) support for temporal events such as clocked sequences; or (4) support for Spectre's netlist language legacy assert device. This last can be addressed via an appropriate combination of the prior two items.

Some simulation systems may support a pragma statement, which is a statement that generally follows a comment-statement like syntax. The presence of the string "psl" immediately after the standard language comment prefix (// for Verilog, // or * for SPICE, —for VHDL, etc) indicates that this is not just a general comment to be ignored, but a particular verification statement to be considered by simulators or language compilers that support it. Examples may include

| | |
|---|---|
| // psl a1 : assert always (a \|-> b) @(posedge clk; | Verilog example |
| * psl a1: assert Q1:vbe < 0.4 | SPICE example |
| -- psl s1: assert a > b | VHDL example |

Simulation programs featuring PSL may support a set of verification units (vunits). A vunit can be used to indicate PSL properties in a file separate from the files containing the simulation models themselves. The simulation program can bind the external vunit to the design during simulation.

Various embodiments can allow both pragma-based and vunit-based PSL specifications to be consumed by a SPICE or FastSpice simulator. Applications may include, among others, verifying low power intent, detecting poor connections of multiple-voltage domain devices, and a portable method (across all SPICE netlist consuming simulators) of detecting High-Z or "floating" nodes. In the pragma based approach, property specifications and verification directives, such as assert, for example, could be specified in either the top level netlist, or within a sub-circuit as per the following illustrative example which considers simple invariants:
subckt foo (port1 port2)
parameters p1=1 p2=2
r1 a b resistor r=3k // a, b are internal nodes
r2 port1 b resistor r=2k
r3 c d resistor r=1k // c,d are internal nodes
// psl a1: assert
// V(a)>V(b)+p1* V(port1) // references a, b, p1, port
// psl a2: assert
// foo:1>500 ma // indexed port current references foo:1 i.e. port1
// psl a3: assert
// r1:i<2 mA // references current thru resistor R1
// psl a4: assert
// top.i1.i2.r1:pwr<5 mA // OOMR references ends In the example above, note the a3 property (a simple invariant) defines that the current through resistor r1 is to be less than 2 mA. Property a2 (another simple invariant) notes that the current through the first indexed port of parent "subckt foo" is to be greater than 500 mA at all times. Note that, in some embodiments, SVAS syntax equivalents can also be supported in a like manner. An application of such simple invariants may be used to (dynamically) detect violations introduced via power considerations as illustrated in FIG. 3.

Figure 6:
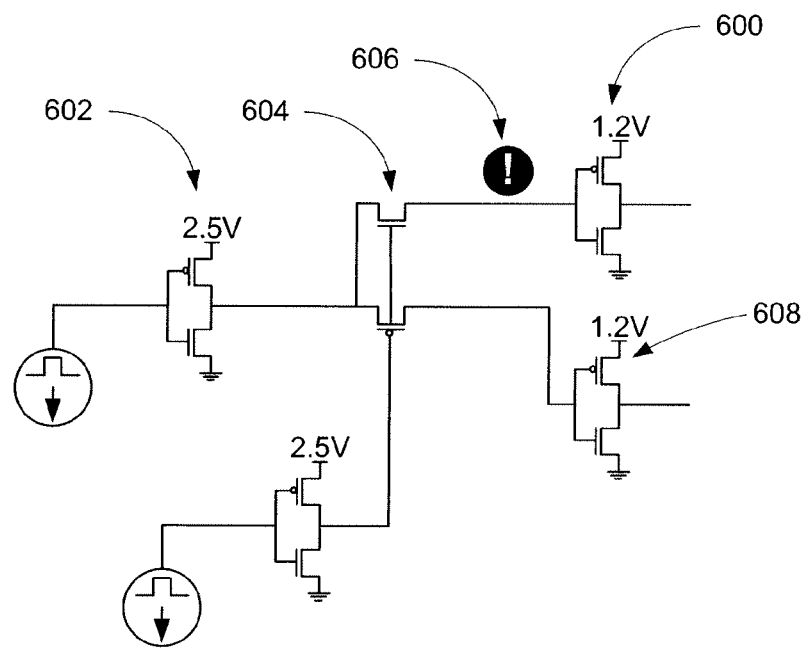
FIG. 6 is a diagram illustrating an example of a circuit with multiple voltage domains incorrectly connected.

FIG. 6 is an example of a circuit 600 that includes multiple voltage domains that are incorrectly connected. Referring now to FIG. 6, the diagram illustrates a 1.2V inverter 602 being driven directly by a 2.5V inverter 604 via the pass gate 606, without any level shifting logic. Such misconnections 608 can lead to either reliability problems or failures in functionality. An invariant property that the gate voltage must always be less than or equal to 1.2 V may appear within a SPICE sub-circuit as the assertion assert property (V(G) <=1.2). When associated with the NMOS or PMOS transistors of the 1.2V inverters 600 and 610, such a property may allow misconnections to be detected during a transistor level, post-layout simulation.

From a flow aspect, some embodiments may automatically generate transistor level assertions, such as the above invariant, from higher order power intent language format such as that specified in Common Power Format (CPF) files or in any other power intent language format such as Unified Power Format (UPF). In another example of the application of assertions to transistor level simulations, some systems may have a portable method to detect floating nodes via high impedance state properties.

Figure 7A:
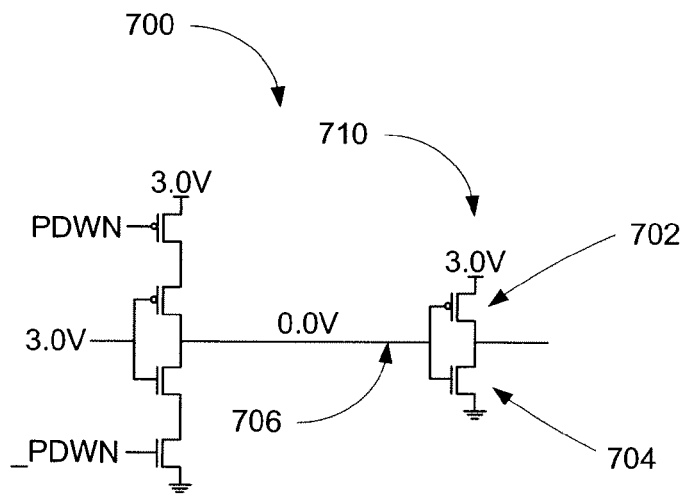
FIGS. 7A, 7B and 7C are diagrams illustrating an example inverter chain with power down capability.
Figure 7B:
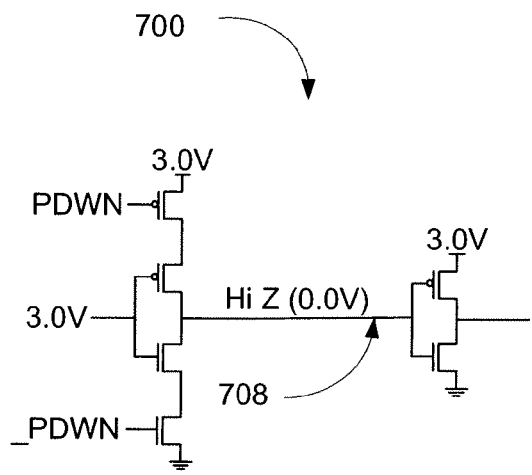
Figure 7C:
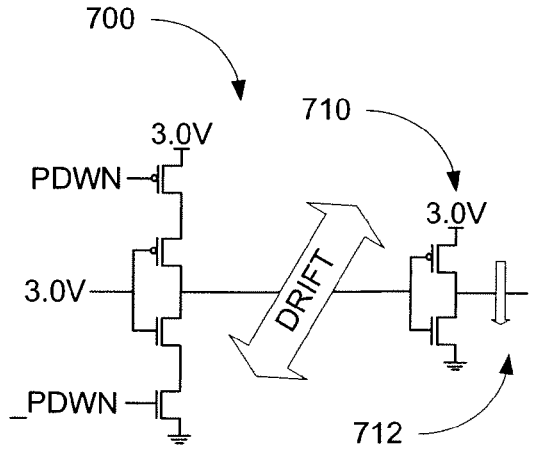

FIGS. 7A-7C illustrate an example of an inverter chain 700, in which the first inverter has a power down capability driven by signal PDWN. Referring now to FIG. 7A, when the power mode is set to power down the block containing that inverter, the topmost PMOS transistor 702 and bottommost NMOS 704 transistor are put in a high impedance state. The connecting node 706, currently 0.0 volts, may be considered a high impedance node 708 as further illustrated in FIG. 7B.

Such nodes 706, 708 might drift high or low, triggering the rightmost inverter 710 to change state 712. It may take a very long simulation to observe this, or it may not be observable at all. Using an assertion based approach that directly accesses the internal states (such as rds, the drain-source resistance) of the SPICE level transistor devices; however, it should be possible to code an assertion that detects such high impedance nodes.

In another example, in an SVAS like syntax clocked sequences may be specified in a subcircuit based on the Spectre netlist language. The clocking event is underlined and Boolean layer analog extensions are in boldface.
subckt dut (clk,a,b,c,d,e,f,g,h,rst)
parameters vthi=0.6 vdelta=0.2 ttol=1e-6 vtol=1e-6
r1 (a b) resistor r=1k
r2 (b c) resistor r=2k
sequence S1;
(V(d)>thi\|\|V(e)>vthi\|\|V(f)>vthi);
endsequence
sequence S2;
(S1 ##[3:5] V(h)>vthi);
endsequence
property P2_compare;
@(cross V(clk)–vth–1) // "negedge of clock"
V(a)>vthi ##2 V(b)>vthi\|=>(S2);
endproperty
assert property (P2_compare);
property P3_compare;
@(absdelta(V(rst), vdelta, ttol, vtol))) // rst changes by a significant amount
V(a)>vthi ##2 V(b)>vthi\|=>(S2);
endproperty
assert property (P3_compare);
ends The above example illustrates clocked sequences, where the sequence events are sampled upon a negative clock edge based on V(clk) falling below a threshold vth. As such, the SVA temporal layer, for example, the sequence layer 404, might not be changed. The Boolean layer 406 and clocking events illustrated may be changed, however. In some embodiments, this approach might be sufficient to allow for assert-based verification of many digital-like block properties while the simulation is being performed by an analog simulation tool.

The above assertion property also contains an implication operator "\|=>" The implication refers to a situation in which a preceding sequence must occur before a specified behavior can occur. In terms of the above example, the preceding sequence is:
V(a)>vthi ##2 V(b)>vthi Once that anteceding sequence has occurred, then the consequent sequence S2 is expected occur. When unrolled, the consequent sequence may be:
(V(d)>thi\|V(e)>vthi\|V(f)>vthi) ##[3:5] V(h)>vthi Where the ## notation (per SVA) can indicate the notion of a clocking event somewhere, ##2 indicates two clock cycles, and ##[3:5] indicates anywhere between three and five clocking cycles. In some embodiments, a clocking statement (implicit or explicit) may be associated with the above.

The clocking expression for the p3_compare property can be:
property P3_compare;
@((absdelta(V(rst), vdelta, ttol, vtol))) // rst changes by a significant amount
V(a)>vthi ##2 V(b)>vthi|=>(S2);
endproperty Here, the absdelta function is introduced, by which if the value of V(rst) changes by a significant amount, any such significant change is considered to be a clocking event. Note that PSLS syntax equivalents of the above are also considered.

Figure 8:
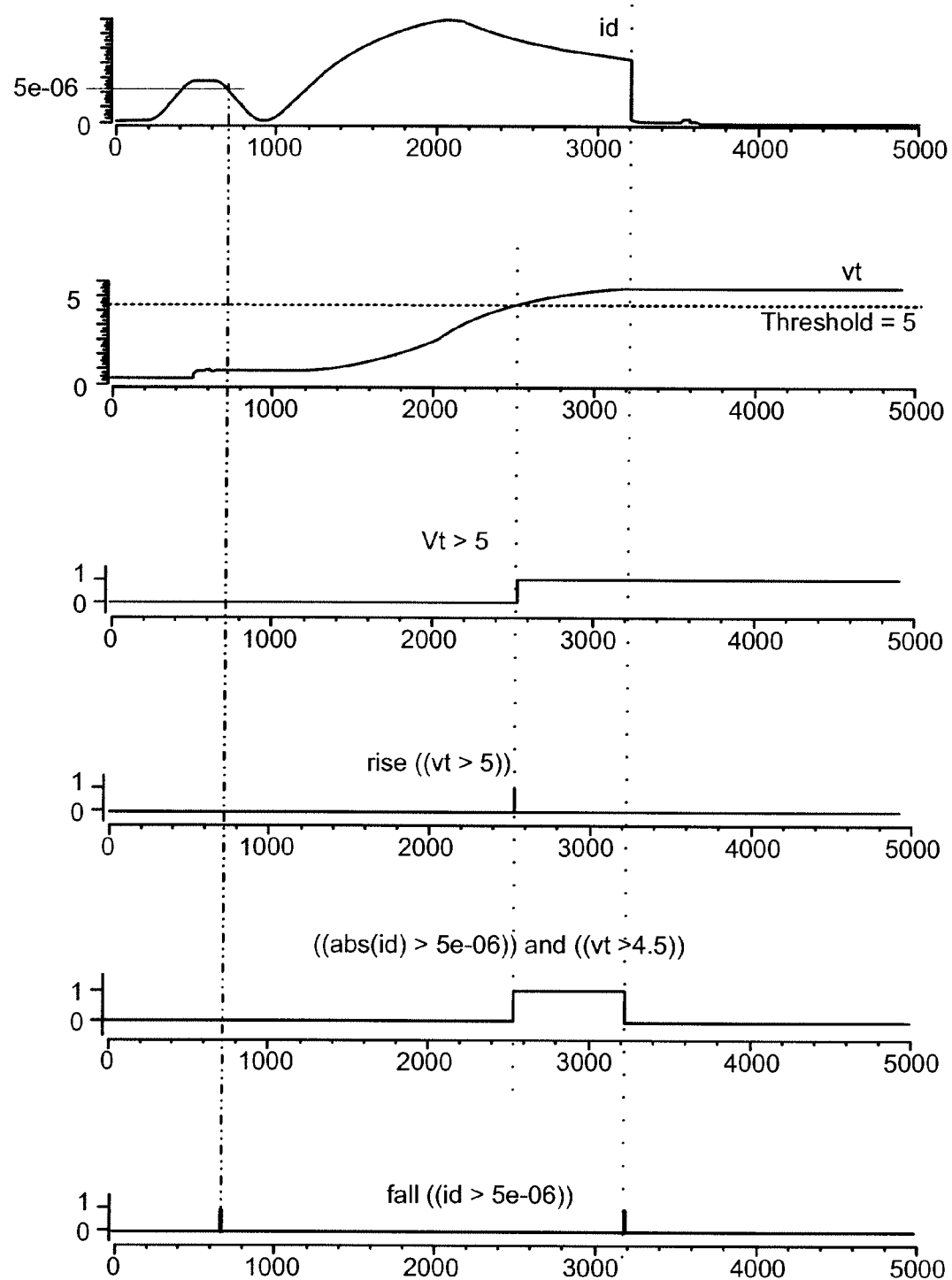
FIG. 8 is a diagram illustrating waveforms for a flash memory programming example.

An analog-centric expression is an expression containing operators and function calls such as abs( ), idt( ) ddt( ) (representing the absolute value function, an integral with respect to time, and a derivative with respect to time, respectively), which are commonly encountered in an analog modeling or verification world, and which are required in order to write non trivial single-event temporal properties. An example related to programming a flash memory cell is illustrated in FIG. 8. Referring now to FIG. 8, whenever the cell threshold voltage 'Vt' signal crosses above the threshold of 5 volts, both the threshold voltage 'Vt' and cell current 'Id' have to remain continuously above 4.5 and 5e-6 respectively, until the absolute value of the cell current id falls below 5e-6.

The STL/PSL specification for this property is:
pgm1 assert:
always (above(vt, 5)→
    ((abs (id))>5e-6) and (vt>4.5))
until (below(id, 5e-6)));

With continued reference to FIG. 8, the waveforms can be used to illustrate an example of PSL Language Reference Manual (LRM) Boolean Expression details. According to the PSL LRM, expressions in the Boolean layer are built from HDL expressions, PSL expressions, PSL built-in functions, endpoint instances, and union expressions as per the following BNF. A somewhat similar discussion will apply to the SVA Boolean Layer.
HDL_or_PSL_Expression ::=
    HDL_Expression
    |PSL_Expression
    |Built_In_Function_Call
    |Union_Expression
    |Endpoint_Instance The PSL language allows the Boolean layer to reference any legal HDL expression in the host language, which may be Verilog, VHDL, or other languages. Some embodiments using property specification languages extend a subset of valid SPICE/Spectre/MDL expressions. In particular some embodiments consider only SPICE/Spectre/MDL expressions that map onto the following form:
SPICE_or_PSL_Expression ::=
    SPICE_Expression
    |PSL_Expression
    |Built_In_Function_Call
    |Union_Expression
In which the SPICE expression is further limited to
SPICE_Expression ::=
    (SPICE_Expression|SPICE_Expression)
    |(SPICE_Expression && SPICE_Expression)
    |! SPICE_Expression
    |Comparison_Expression
Comparison_Expression ::=
    Term Relop Term
Term ::=
    Term ArithmeticOp Term
    |(Term)
    |Analog_func_call(Term)
    |Instance_parameter,
    |Operating_point_parameter,
    |Netlist_parameter,
    |Device_terminal_current_specifier
    |Subckt_parameter
    |integer_constant
    |real_constant
    |AccessFunction
ArithmeticOp ::=**|*|/|+|−
AccessFunction ::=
    V(Node_identifier)
    |V(Node_identifier, Node_identifier)
    |I<Port_or_branch_specifier>
    |I(Node_identifier, Node_identifier)
Relop ::=<|<=|>|>=|== where the following also holds: (1) Analog_func_call is a call to an analog real valued function (see below); (2) Node_identifier is a reference to a SPICE sub-circuit terminal or local node; (3) Port_or_branch specifier is a reference to a port in the enclosing SPICE sub-circuit or a named branch contained therein (see Verilog-A for example); (4) Instance_parameter is a reference to a device instance parameter for example, M1:w; (5) Operating_point_parameter is a reference to a device instance operating point parameter for example, Q1:vbe; (6) Netlist_parameter is a reference to any global Netlist parameter; (7) Device_terminal_current_specifier is a reference to a terminal current of the N'th or named port of a device for example, M1:1 or M1:d (where 'd' further denotes drain terminal); (8) Subckt_parameter is any parameter to the enclosing SPICE sub-circuit; and (9) AccessFunction is a reference to a branch voltage, branch current, node voltage, port current.

Here, the 'SPICE_Expression' is used to denote analog expressions, such as expressions involving analog values in the natural language of the SPICE simulator. Such analog expressions should typically be used in conjunction with a relational operator Relop such as <, <=, >, >=, ==. The Built_In_Function_Call in the above BNF production refers to PSL Built-in functions, which assume bitwise arguments.

Some embodiments may extend the range of single-event temporal properties that can be written by allowing the Term production in the above BNF to leverage Verilog-AMS like "analog" built-in functions via the Analog_func_call production. In doing so, the embodiments may include functions that accept real-valued arguments such as the following exemplary math system functions and analog kernel parameter system functions.

Examples of Verilog-AMS Math System Functions include $c log 2, $ ln, $ log 10, $exp, $sqrt, $pow, $floor, $ceil, $ sin, $ cos, $ tan, $ a sin, $ a cos, $a tan, $a tan 2, $hypot, $ sin h, $ cos h, $ tan h, $a sin h, $a cos h, and $a tan h. Examples of Verilog-AMS Analog kernel parameter system functions may include $temperature, $vt, $simparam, $simparam, and $str.

Note that in the above PSL language standard BNF production, an HDL_or_PSL_Expression can include calls to a Built_In_Function_Call. The BNF for that is further listed below:
Built_In_Function_Call ::=
prev (Any_Type [, Number])
|next (Any_Type)
|stable (Any_Type)
|rose (Bit)
|fell (Bit)
|isunknown (BitVector)
|countones BitVector)

|onehot (BitVector)
|onehot0(BitVector)

PSL built-in function calls can accept arguments of various types, including any type, Bit, Bit Vector, or other argument types. Where those accommodate Boolean expressions, some embodiments allow for expression of the form Relop as arguments. In some embodiments, Relop must resolve to a Boolean value via the relational comparison operators.

In embodiments using SVA, a similar approach may be adopted to allow for assertions such as that provided in the following example. In SVA, BNF Expressions in the Boolean Layer of SVA are primarily of the form sequence_expr, which is itself primarily of the form expression:
sequence_expr ::=
cycle_delay_range sequence_expr {cycle_delay_range sequence_expr }
|sequence_expr cycle_delay_range sequence_expr { cycle_delay_range sequence_expr}
|expression {, function_blocking_assignment} [boolean_abbrev ]
|(expression {, function_blocking_assignment}) [boolean_abbrev]
|sequence_instance [sequence_abbrev]
|(sequence_expr) [sequence_abbrev]
|sequence_expr and sequence_expr
|sequence_expr intersect sequence_expr
|sequence_expr or sequence_expr
|first_match (sequence_expr)
|expression throughout sequence_expr
|sequence_expr within sequence_expr
expression ::=
primary
|unary_operator {attribute_instance} primary
|inc_or_dec_expression
|(operator_assignment)
|expression binary_operator {attribute_instance} expression
|conditional_expression
|string_literal
|inside_expression As with the PSLS example discussed above, some embodiments may modify this for the SPICE case to replace expression with the SPICE_Expression of the form discussed previously:
SPICE_Expression ::=
   (SPICE_Expression||SPICE_Expression)
   |(SPICE_Expression && SPICE_Expression)
   |! SPICE_Expression
   |Comparison_Expression In the PSL LRM, clocking expressions are defined according to the following BNF:
Clock_Expression :=
boolean_Name
|boolean_Built_In_Function_Call
|Endpoint_Instance
|(Boolean)
|(HDL_CLK_EXPR)
Flavor Macro HDL_CLK_EXPR=
SystemVerilog: SystemVerilog_Event_Expression
/ Verilog: Verilog_Event_Expression
/ VHDL: VHDL_Expression
/ GDL: GDL_Expression In some embodiments, Booleans such as Boolean HDL expressions and PSL expressions can be used as clock expressions to indicate when other Boolean expressions are evaluated. In one embodiment, any PSL expression that is a Boolean expression can be used as a clock expression. In particular, PSL the built-in functions rose( ) and fell( ) and endpoint instances, can be used as clock expressions for the Booleans in the parenthesis. Boolean names, built-in function calls, and endpoint instances can also be used as clock expressions without enclosing them in parentheses.

Additionally, in some Verilog embodiments, any expression that Verilog allows to be used as the condition in an "if" statement can be used as a clock expression. Likewise, any Verilog event expression that is not a single Boolean expression can be used as a clock expression. Such a clock expression is considered to hold in a given cycle if it generates an event in that cycle.

For various Spectre/SPICE netlist language embodiments of the PSLS extensions, HDL_CLK_EXPR may be extended to allow for the SPICE equivalent of the Verilog-AMS analog cross event. An example follows, with the pertinent event underlined.
//psl analog_example1: assert
// always (out1 <1.25) @(cross(V(clk)−1.25, +1));

This extension may allow properties to be asserted while synchronized to clocking events, which are driven by the analog simulation module. Such extensions might be useful when clocked networks are being simulated in detail in the presence of parasitic networks in post-layout simulation such as, for example, when the clock signals are 'resolved' to analog in the simulator. In the case of Verilog-A (pure Verilog-A, with no MS extensions), it may also allow purely analog behavioral models of mixed-signal circuits (such as ADC, DAC converters) to also be verified using the ABV approach, where all the signals are solved for by the analog simulator.

Some embodiments may support the notion of the absdelta event as illustrated in the following example:
property P3_compare;
@(absdelta(V(rst), vdelta, ttol, vtol))) // rst changes by large amount
V(a)>vthi ##2 V(b)>vthi|=>(S2);
endproperty The general form is:
absdelta(expr, delta [, time_tol [, expr_tol]]);
where expr and delta are required, while time_tol and expr_tol are optional. All arguments are real expressions, while expr is an analog signal expression.

The absdelta( )-function triggers events at the following specified times and conditions: (1) when the analog solver finds a stable solution during initialization or at time zero (and in the case of a mixed-signal simulation the analog solver may need to find multiple stable solutions due to analog-digital signal interaction); (2) when expr value changes more than delta, plus or minus expr_tol, relative to the previous triggered value; or (3) when the expr starts to change direction.

The absdelta( ) function may also ignore events at the following specified time and conditions: (1) when the expr changes direction but the amount of change is within the expr_tol of the expr evaluated at the previous event time; and (2) when the current time is within time_tol of the previous event time even if the expr change is larger than delta.

During transient analysis, the absdelta( ) does not necessarily generate events at every analog solution time point, so that the event time sequences are as even as possible when the expr is smooth over time. It also might not be necessary to force an analog solution point.

If expr_tol is not specified, the default is the absolute voltage tolerance (vabstol) of the analog solver. If expr_tol is specified, time_tol should also be specified. If time_tol is not specified, when expr_tol is also not, the default time_tol is the time precision of the SPICE minstep convergence parameter. Any value time_tol specified smaller than the minstep is ignored.

In the PSL LRM, a default clock declaration specifies a clock expression for directives that have an outermost property or sequence that has no explicit clock expression, per the following BNF:
Clock_Declaration ::=
default clock DEF_SYM Clock_Expression;

If the outermost property of an assert, assume, or assume_guarantee directive has no explicit clock expression, then the clock expression for that property is given by the applicable default clock declaration, if one exists. Otherwise the clock expression for the property is the expression True. By way of example, in a Verilog embodiments, example code might include:
default clock=(posedge clk1);
assert always ((V(a)>vthi)→next (V(b)>vthi));
is equivalent to
assert (always ((V(a)>vthi)→next (V(b)>vthi)))@(posedge clk);

In order to support the verification of systems in which the clock net is an analog value, some embodiments extend the Clock_Expression in the above BNF to include analog cross events. For example,
default clock=(cross(V(clk)−1.25, +1));
assert always ((V(a)>vthi)→next (V(b)>vthi));
which will be equivalent to:
assert (always (req→next ack))@(posedge clk);

Various embodiments allow absdelta events to be referenced in these same contexts. For example,
default clock=absdelta(V(rst), vdelta, ttol, vtol);
assert always ((V(a)>vthi)→next (V(b)>vthi));

The BNF for the clocking expressions in SVA is as follows:
property_spec ::=[clocking_event] [disable iff (
expression_or_dist)] property_expr
where clocking_event is further defined as
clocking_event ::=
@ identifier
|@ (event_expression)
event_expression ::=
[edge_identifier] expression [iff expression]
|sequence_instance [iff expression]
|event_expression or event_expression
|event_expression, event_expression
edge_identifier ::=posedge|negedge As for the PSL case, various embodiments support something akin to the following example, in which introducing a cross or absdelta expression is introduced as a valid event for clocking SVA assertion sequences:
event_expression ::=
[edge_identifier] expression [iff expression]
|cross_expression
|absdelta_expression
|sequence_instance [iff expression]
|event_expression or event_expression
|event_expression, event_expression Some embodiments of an Assertion/Property Specification language include a temporal layer. The temporal layer is used to describe properties of the design over a time interval or multiple clock cycles, for example. It is known as the temporal layer because, in addition to simple properties such as "signals a and b are mutually exclusive," it can also describe properties involving complex temporal relations between signals. An example of a complex relation is: "If signal c is asserted, then signal d shall be asserted before signal e is asserted, but no more than eight clock cycles later." Temporal expressions are typically evaluated over a series of evaluation cycles.

Some embodiments may include extensions to the temporal or sequence layers that may relate to the introduction of the notion of dense time. Dense time is illustrated by the example below. This example provides that "within 600 milliseconds after the (Boolean) trigger rises, |x| has to drop below 1 and stay in that state for at least 300 milliseconds."
vprop mixed signal {
stabilization assert:
always (abs(V(x)<6) and (cross(v(trigger−vth, +1)→
eventually[0:600] ms always[0:300] ms abs(V(x))<1)));
}

In this case, the notion of dense time is introduced via the square bracket/range/time-unit combination. Time values in the above are assumed to be in simulator time units, however other embodiments can use other expressions for time. Some embodiments may support multiple numeric scalars including the Spectre language standards of ms, us, ps, fs; (small numbers) and ks, MS, ts, as, and other language standards.

In some embodiments, there is an alternate syntax, for example:
eventually[0 ms:600 us] always[1 fs:300 ns] abs(V(x))<1)));

With respect to FIG. 4, the verification layer in a property specification language like PSL or SVA provides information to the Verification tools regarding what to do with properties specified by the temporal layer. In some embodiments, the verification layer supports a set of directives, called verification directives, which direct a verification tool to check or assume the validity of a property.

For the Verilog-AMS simulator, some embodiments may support the same set of verification directives that are supported in the discrete, event-driven simulator cases (including coverage, for example). Various embodiments may include extensions related to the following potential candidates for PSL: (1) assert; (2) assume; (3) assume_guarantee; (4) cover; (5) restrict; (6) restrict_guarantee; (7) fairness; or (8) strong_fairness. Some embodiments may include extensions related to the following candidates for SVA such as assert, assume, or cover. It will be understood that other extensions are also possible for PSL, SVA, or other simulation products. For the SPICE simulator cases, the set of directives to be supported may include the assert directive and may also include others directives.

In some embodiments, a variation on the "synthesis to host language during parsing" approach may be followed to implement PSLS and SVAS in a SPICE/FastSpice class simulator.

Consider the following sub-circuit:
subckt foo (port1 port2)
parameters p1=1 p2=2
r1 a b resistor r=3k // a, b are internal nodes
r2 port1 b resistor r=2k
r3 c d resistor r=1k // c,d are internal nodes
// psl a1: assert
// V(a)>V(b)+p1* V(port1) // references a, b, p1, port
// psl a2: assert
// foo:1>500 ma // references foo:1 i.e. port1
// psl a3: assert
// r1:i<2 mA // references current thru R1
// psi a4: assert
// top.i1.i2.r1:pwr <5 mA // OOMR references ends Some embodiments may synthesize the above to the equivalent set of lexical tokens below during the assertion processing. Note the synthesis process inserts references to some new devices foo_a1_behav, and foo_a2_behav for example.
subckt foo (port1 port2)
parameters p1=1 p2=2
r1 a b resistor r=3k // a, b are internal nodes
r2 port1 b resistor r=2k
r3 c d resistor r=1kl
a1 (port1, a, b) foo_a1_behav p1_a1=p1
a2 (port1) foo_a2_behav
a3 ( ) foo_a3_behav p1_a3='r1' p2_a3="pwr"
a4 foo_a4_behav p1_a4="top.i1.i2.r1:pwr"
ends This extra step can be used because the Spectre or SPICE netlist languages themselves do not have a particularly rich set of behavioral constructs or expressions. By inserting instances of some other objects, this approach allows further synthesis of the objects themselves in an alternate language (Verilog-A) which is rich in behavioral constructs. Various embodiments may therefore synthesize the following Verilog-A modules:
module foo_a1_behav(port1, a, b); // port2 not required
parameters p1_a1;
integer a1_tmp_;
analog begin
a1_tmp_=V(a)>V(b)+V(port1);
end
endmodule
module foo_a2_behav(port1); // port2, a, b not required
integer a2_tmp_;
analog begin
a2_tmp_=V(a)>V(b)+V(port1);
end
endmodule
module foo_a3_behav( )
parameters p1_a3="", p2_a3="";
real a3_tmp_r_; // holds the value of the mdl property
integer a3_tmp_; // boolean layer
analog begin
a3_tmp_r_=$sys_eval(p1_a3, p2_a3);
a3_tmp_=a3__4<2 mA; // Boolean layer eval
end
endmodule
module foo_a4_behav( )
parameters p1_a4="";
integer a4_tmp_;
analog begin
a4_tmp_=$sys_eval (p1_a4)
end
endmodule
Note that several variants exist here, some of which are simple modules such as the first and second ones, which evaluate simple invariants using simple Verilog-A. Others such as the third and fourth include references to $sys_eval( ) a system function, which takes multiple string arguments and uses analog simulator's internal expression processing engine to evaluate a simple or complex expression.

In another example, in a more SVAS-like syntax, an embodiment that may be implemented using, for example, SPICE may include:
subckt dut (clk,a,b,c,d,e,f,g,h,rst)
parameters vthi=0.6 // threshold voltage over which analog value is logic 1
r1 (a b) resistor r=1k
r2 (b c) resistor r=2k . . .
sequence S1;
(V(d)>thi|V(e)>vthi|V(f)>vthi);
endsequence
sequence S2;
(S1 ##[3:5] V(h)>vthi);
endsequence
property P2_compare;
@(cross V(clk), with −1) // "negedge of clock"
V(a)>vthi ##2 V(b)>vthi|=>(S2);
endproperty
assert property (P2_compare);
ends The above could conceivably result in the creation of the following modified sub-circuit (underlined portion might be synthesized in place of the SVAS above)
subckt dut (clk,a,b,c,d,e,f,g,h,rst)
r1 (a b) resistor r=1k
r2 (b c) resistor r=2k
a1 (a b d e f h) dut a1 behav
ends
In addition to the above, some example systems may also synthesize a Verilog-A module that looks somewhat like the following:

```
module dut_a1_behav (a,b,d,e,f,h,clk);
input a,b,d,e,f,h; input clk;
integer [32:1] P2_compare_state_ ; // current result state
integer [1:4] P2_compare_tmp_ ; // sampled value of input exprs
analog begin: P2_compare_samples_
    // initialize things
    @initial_step begin : P2_compare_initial_
        P2_compare_state_ = $veriloga_wrap_nc_assertion_update(1);
        // assertion_update notifies the runtime environment of
        // changes, prints log messages, etc.
    end
    // sampled inputs needed
    // sample the boolean layer expressions at every timestep
    P2_compare_tmp_ [1] = (V(a) > vthi);
    P2_compare_tmp_ [2] = (V(b) > vthi);
    P2_compare_tmp_ [3] = (V(d) > thi || V(e) > vthi || V(f) > vthi);
    P2_compare_tmp_ [4] = (V(h) > vthi);
    // arrays since Verilog-A doesn't have bit buses
    @(cross V(clk), vth −1) begin : P2_compare_assert_
        if ((( P2_compare_state_ & 'h3ff)!== 'd6 ) &&
            ((P2_compare_state_ & 'h3ff)!== 'd7 )) begin
            // skip if the assertion is turned off (for example, from
            // interactive prompt)
            if ((P2_compare_state_ & 'h3ff)!== "d1 ||
                (((P2_compare_tmp_ [1] )))) begin
            // skip if assertion is inactive and initial condition
            input is false
                P2_compare_state_ =
                    $veriloga_wrap_nc_sequence_eval(
                        P2_compare_tmp_ , 1 );
                // veriloga_wrap_sequence_eval does the heavy
                // lifting for
                // temporal expressions
            end else begin
                // for SVA, we need to count the vacuous attempts
                // as well
                $veriloga_wrap_nc_vacuous(P2_compare );
                $veriloga_wrap_nc_attempts(P2_compare );
            end
        end // if (( P2_compare_state_ ...)
    end // cross V(clk, vth...)
end // analog block P2_compare_samples_
endmodule
```

The term tool can be used to refer to any apparatus configured to perform a recited function. For example, tools can include a collection of one or more modules and can also be comprised of hardware, software or a combination thereof. Thus, for example, a simulation and verification tool can be a collection of one or more software modules, hardware modules, software/hardware modules or any combination or permutation thereof. As another example, a tool can be a computing device or other appliance on which software runs or in which hardware is implemented.

Figure 9:
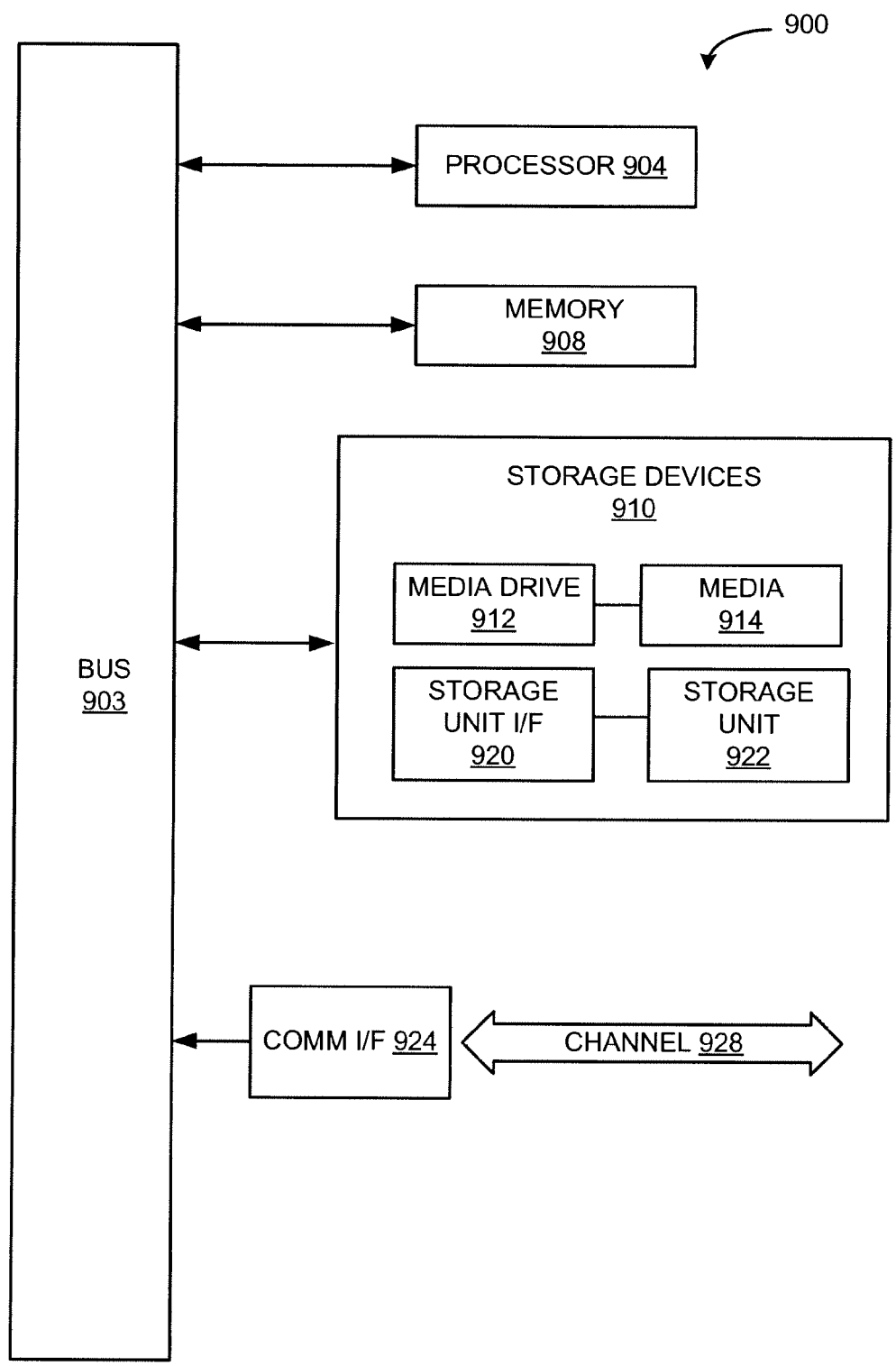
FIG. 9 is a diagram illustrating an example computing module in accordance with the systems and methods described herein.

As used herein, the term module describes a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 9. Various embodiments are described in terms of this example-computing module 900. After reading this description, it will become apparent to a person skilled in the relevant art how to implement the invention using other computing modules or architectures.

Referring now to FIG. 9, computing module 900 may represent, for example, computing or processing capabilities found within desktop, laptop and notebook computers; handheld computing devices (PDA's, smart phones, cell phones, palmtops, and other handheld computing devices); mainframes, supercomputers, workstations or servers; or any other type of special-purpose or general-purpose computing devices as may be desirable or appropriate for a given application or environment. Computing module 900 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 900 might include, for example, one or more processors, controllers, control modules, or other processing devices, such as a processor 904. Processor 904 might be implemented using a general-purpose or special-purpose processing engine such as, for example, a microprocessor, controller, or other control logic. In the example illustrated in FIG. 9, processor 904 is connected to a bus 903, although any communication medium can be used to facilitate interaction with other components of computing module 900 or to communicate externally.

Computing module 900 might also include one or more memory modules, simply referred to herein as main memory 908. For example, preferably random access memory (RAM) or other dynamic memory, might be used for storing information and instructions to be executed by processor 904. Main memory 908 might also be used for storing temporary variables or other intermediate information during execution of instructions to be executed by processor 904. Computing module 900 might likewise include a read only memory ("ROM") or other static storage device coupled to bus 903 for storing static information and instructions for processor 904.

The computing module 900 might also include one or more various forms of information storage mechanism 910, which might include, for example, a media drive 912 and a storage unit interface 920. The media drive 912 might include a drive or other mechanism to support fixed or removable storage media 914. For example, a hard disk drive, a floppy disk drive, a magnetic tape drive, an optical disk drive, a CD or DVD drive (R or RW), or other removable or fixed media drive might be provided. Accordingly, storage media 914, might include, for example, a hard disk, a floppy disk, magnetic tape, cartridge, optical disk, a CD or DVD, or other fixed or removable medium that is read by, written to or accessed by media drive 912. As these examples illustrate, the storage media 914 can include a computer usable storage medium having stored therein computer software or data.

In alternative embodiments, information storage mechanism 910 might include other similar instrumentalities for allowing computer programs or other instructions or data to be loaded into computing module 900. Such instrumentalities might include, for example, a fixed or removable storage unit 922 and an interface 920. Examples of such storage units 922 and interfaces 920 can include a program cartridge and cartridge interface, a removable memory (for example, a flash memory or other removable memory module) and memory slot, a PCMCIA slot and card, and other fixed or removable storage units 922 and interfaces 920 that allow software and data to be transferred from the storage unit 922 to computing module 900.

Computing module 900 might also include a communications interface 924. Communications interface 924 might be used to allow software and data to be transferred between computing module 900 and external devices. Examples of communications interface 924 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 924 might typically be carried on signals, which can be electronic, electromagnetic (which includes optical) or other signals capable of being exchanged by a given communications interface 924. These signals might be provided to communications interface 924 via a channel 928. This channel 928 might carry signals and might be implemented using a wired or wireless communication medium. These signals can deliver the software and data from memory or other storage medium in one computing system to memory or other storage medium in computing system 900. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to physical storage media such as, for example, memory 908, storage unit 920, and media 914. These and other various forms of computer program media or computer usable media may be involved in storing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 900 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be used to implement the desired features of the present invention. Also, a multitude of different constituent module names other than those depicted herein can be applied to the various partitions. Additionally, with regard to flow diagrams and operational descriptions, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

What is claimed:

1. A computer implemented method of simulating and verifying a design comprising:
   receiving a set of verification rules for a design, wherein the verification rules use a PSL or an SVA syntax in a SPICE netlist to describe a property of the circuit design;
   determining a state for a circuit at a simulated predetermined first time;
   analyzing the state at the predetermined first time to determine if a triggering event has occurred; and
   upon or after the occurrence of the triggering event, verifying the state at the predetermined first time against the set of verification rules.

2. The method of claim 1, further comprising:
   referencing SPICE-named spaced objects and SPICE computed attributes within PSL or SVA syntaxes;
   referencing expressions using SPICE objects; and
   constructing a parse tree for the temporal property and for a verification directive related to the temporal property.

3. The method of claim 1, further comprising evaluating temporal expressions within a SPICE simulator and determining the temporal expressions status at a simulation time.

4. The method of claim 1, wherein the design comprises a mixed-signal circuit including an analog portion and a digital portion.

5. The method of claim 1, wherein the design comprises an analog circuit.

6. The method of claim 1, wherein the design comprises a digital circuit.

7. The method of claim 1, further comprising:
   determining a state for the circuit at a simulated second time; and
   checking for convergence for a set of solutions for a series of equations at the simulated second time after the first time.

8. The method of claim 7, further comprising checking for convergence for a set of solutions for a series of equations at another time, because a set of solutions for a series of equations at the simulated second time did not converge within a number of calculations.

9. The method of claim 7, further comprising triggering a verification based on the convergence of a set of solutions.

10. The method of claim 1, further comprising triggering a verification based on checking a threshold, a change in a measured value that is greater than a predetermined amount, or a predetermined verification trigger time.

11. The method of claim 10, wherein the threshold comprises a predetermined change from a current value, the change in the measured value occurs in less than some predetermined period, or wherein the predetermined verification trigger time is based on the time of an event.

12. The method of claim 1, wherein the circuit is modeled using a netlist.

13. The method of claim 12, wherein the circuit is modeled using a SPICE netlist.

14. A system for simulating and verifying a circuit design comprising:
   a processor, configured to:
      simulate a circuit to determine a state for the circuit at a simulated predetermined first time, t1; and
      analyze the state at the first time to determine if a triggering event has occurred, based on a rule for triggering; and
   a verification module, configured to:
      determine a set of verification rules for the design, wherein the verification rules use a PSL or an SVA syntax in a SPICE netlist to describe a temporal property of the circuit design; and
      upon or after the occurrence of the triggering event, verify the state at the first time against the set of verification rules.

15. The system of claim 14, wherein the system is further configured to:
   reference SPICE-named spaced objects and SPICE computed attributes within PSL or SVA syntaxes;
   reference expressions using the SPICE objects; and
   construct a parse tree for the temporal property and for a verification directive related to the property.

16. The system of claim 14, wherein the system is further configured to:
   evaluating temporal expressions within a SPICE simulator and determining the temporal expressions status at a simulation time.

17. The system of claim 14, wherein the design comprises a mixed-signal circuit including an analog portion and a digital portion.

18. The system of claim 14, wherein the design comprises an analog circuit.

19. The system of claim 14, wherein the design comprises a digital portion.

20. The system of claim 14, wherein the simulation module:
  determines a state for the circuit at a simulated second time; and
  checks for convergence for a set of solutions for a series of equations at the simulated second time after the first time.

21. The system of claim 14, wherein the system checks for convergence for a set of solutions for a series of equations at another time because a set of solutions for a series of equations at a simulated second time did not converge within a number of calculations.

22. The system of claim 21, wherein the simulation module triggers a verification based on the convergence of a set of solutions.

23. The system of claim 14, wherein the simulation module triggers a verification based on checking a threshold, based on a change in a measured value that is greater than a predetermined amount, or based on a predetermined verification trigger time.

24. The system of claim 23, wherein the threshold comprises a predetermined change from a current value, the change in the measured value occurs in less than some predetermined period or wherein the predetermined verification trigger time is based on the time of an event.

25. The system of claim 14, wherein the circuit is modeled using a netlist.

26. The system of claim 25, wherein the circuit is modeled using a SPICE netlist.

27. A non-transitory computer readable medium comprising computer executable instructions adapted to cause a computer to:
  receive a set of verification rules for a design, wherein the verification rules use a PSL or an SVA syntax in a SPICE netlist to describe a property of the circuit design;
  determine a state for a circuit at a simulated predetermined first time;
  analyze the state at the first time to determine if a triggering event has occurred; and
  upon or after the occurrence of the triggering event, verify the state at the first time against the set of verification rules.

28. The computer readable medium of claim 27, further comprising computer executable instructions adapted to cause a computer to:
  reference SPICE-named spaced objects and SPICE computed attributes within PSL or SVA syntaxes;
  reference expressions using the SPICE objects; and
  construct a parse tree for the temporal property and for a verification directive related to the temporal property.

29. The computer readable medium of claim 27, further comprising computer executable instructions adapted to cause a computer to evaluate temporal expressions within a SPICE simulator and determining the temporal expressions status at a simulation time.

30. The computer readable medium of claim 27, further comprising computer executable instructions adapted to cause a computer to process a mixed-signal circuit including an analog portion and a digital portion.

31. The computer readable medium of claim 27, further comprising computer executable instructions adapted to cause a computer to process an analog circuit.

32. The computer readable medium of claim 27, further comprising computer executable instructions adapted to cause a computer to process a digital circuit.

33. The computer readable medium of claim 27, further comprising computer executable instructions adapted to cause a computer to:
  determine a state for the circuit at a simulated second time; and
  check for convergence for a set of solutions for a series of equations at the simulated second time after the first time.

34. The computer readable medium of claim 33, further comprising computer executable instructions adapted to cause a computer to check for convergence for a set of solutions for a series of equations at another time, $t_2^*$, because a set of solutions for a series of equations at the simulated second time, $t_2$, did non converge within a number of calculations.

35. The computer readable medium of claim 33, further comprising computer executable instructions adapted to cause a computer to trigger a verification based on the convergence of a set of solutions.

36. The computer readable medium of claim 27, further comprising computer executable instructions adapted to cause a computer to trigger a verification based on checking a threshold, a change in a measured value that is greater than a predetermined amount, or a predetermined verification trigger time.

37. The computer readable medium of claim 36, further comprising computer executable instructions adapted to cause a computer to process a threshold that comprises a predetermined change from a current value, the change in the measured value occurs in less than some predetermined period, or wherein the predetermined verification trigger time is based on the time of an event.

38. The computer readable medium of claim 27, further comprising computer executable instructions adapted to cause a computer model a circuit using a netlist.

39. The computer readable medium of claim 38, further comprising computer executable instructions adapted to cause a computer to model a circuit using a SPICE netlist.

* * * * *